United States Patent
Lin et al.

(10) Patent No.: US 7,658,988 B2
(45) Date of Patent: *Feb. 9, 2010

(54) PRINTED CIRCUITS PREPARED FROM FILLED EPOXY COMPOSITIONS

(75) Inventors: Pui-Yan Lin, Hockessin, DE (US); Govindasamy Paramasivam Rajendran, Garnet Valley, PA (US); George Elias Zahr, Glen Mills, PA (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 216 days.

This patent is subject to a terminal disclaimer.

(21) Appl. No.: 11/732,344

(22) Filed: Apr. 3, 2007

(65) Prior Publication Data
US 2007/0231469 A1    Oct. 4, 2007

Related U.S. Application Data

(60) Provisional application No. 60/788,864, filed on Apr. 3, 2006.

(51) Int. Cl.
*B32B 9/00*    (2006.01)

(52) U.S. Cl. ............... 428/209; 174/258; 361/750; 428/323; 428/325; 428/901

(58) Field of Classification Search ........... 428/209; 174/256, 258; 361/750
See application file for complete search history.

(56) References Cited

U.S. PATENT DOCUMENTS

| | | | |
|---|---|---|---|
| 4,798,762 A * | 1/1989 | Okada et al. | 428/300.7 |
| 4,994,316 A * | 2/1991 | Browne et al. | 428/209 |
| 5,055,342 A * | 10/1991 | Markovich et al. | 428/137 |
| 5,126,192 A * | 6/1992 | Chellis et al. | 428/323 |
| 5,670,250 A * | 9/1997 | Sanville et al. | 428/323 |
| 5,677,045 A * | 10/1997 | Nagai et al. | 442/294 |
| 5,888,627 A * | 3/1999 | Nakatani | 428/209 |
| 6,038,133 A * | 3/2000 | Nakatani et al. | 361/760 |
| 6,042,936 A * | 3/2000 | Kempf | 428/323 |
| 6,207,259 B1 * | 3/2001 | Iino et al. | 428/209 |
| 6,359,235 B1 * | 3/2002 | Hayashi | 174/260 |
| 6,562,179 B1 * | 5/2003 | Ikeguchi et al. | 156/307.5 |
| 6,797,345 B2 * | 9/2004 | Okamoto et al. | 428/1.6 |
| 6,798,121 B2 * | 9/2004 | Nakatani et al. | 310/340 |
| 6,805,958 B2 * | 10/2004 | Nakamura et al. | 428/416 |
| 6,855,892 B2 * | 2/2005 | Komatsu et al. | 174/256 |
| 7,488,895 B2 * | 2/2009 | Hayashi et al. | 174/255 |
| 2005/0129895 A1 | 6/2005 | Nakamura | |

FOREIGN PATENT DOCUMENTS

JP    02263858    10/1990

OTHER PUBLICATIONS

Cochrane et al., Hydrophobic Fumed Silica Control of Epoxy Rheology, Modern Paint and Coatings, 1983, p. 1-6, Oct. 1983.

\* cited by examiner

*Primary Examiner*—Cathy Lam
(74) *Attorney, Agent, or Firm*—Gail D. Tanzer

(57) ABSTRACT

Compositions and processes for the preparation of printed circuits from epoxy compositions are provided. The epoxy compositions exhibit low viscosity in the uncured state and low coefficient of thermal expansion in the cured state. The low dielectric constant compositions of the invention are well-suited for use in multi-layer printed circuit boards.

6 Claims, 3 Drawing Sheets

US 7,658,988 B2

PRINTED CIRCUITS PREPARED FROM FILLED EPOXY COMPOSITIONS

FIELD OF THE INVENTION

The present invention is directed to the preparation of printed circuits from epoxy compositions that exhibit low viscosity in the uncured state and low coefficient of thermal expansion in the cured state. The low compositions are well-suited for use in multi-layer printed circuit boards.

BACKGROUND

So called "epoxy resins" are polymeric materials characterized by the presence of more than one epoxide ring per molecule on average. Epoxies have a tremendous range of applications in modern day society. These applications include coatings on metal cans, automotive primers, printed circuit boards, semiconductor encapsulants, adhesives, and aerospace composites. Epoxies are, in general, thermoset polymers which, in the presence of a curing agent, or cross-linking agent, undergo extensive cross-linking to form a three dimensional polymer network. Most cured epoxy resins form relatively dimensionally stable amorphous networks with excellent mechanical strength and toughness; outstanding chemical, moisture, and corrosion resistance; and good thermal, adhesive, and electrical properties. The highly useful combination of properties, along with versatility in formulation and low cost, have led to the widespread use of epoxies in a plethora of adhesive, structural, and coatings applications.

Great demands are placed upon the epoxy employed for the built up layers in the multilayer printed circuit board application. The dielectric layer is desirably matched in coefficient of thermal expansion (CTE) to that of the silicon chip (3-4 ppm/° C.), to avoid the creation of misalignments during thermal cycling, and to that of the copper (ca. 17 ppm/° C.) to avoid stress-induced delamination. Recently, CTE in the out-of-plane direction has taken on increasing importance. The uncured composition must be of sufficiently low viscosity at the lamination temperature that it will fill all the space between conductors; and the cured epoxy must retain sufficient toughness (usually measured as elongation to break) to endure being dropped in use (as in, e.g., a cellular phone). It is also desirable that a simple chemical etching of the surface provide the desired degree of roughness—ca. 0.1 micrometers—for copper deposition by electroless and electrolytic methods and exhibit an adhesive strength of ca. 6 N/cm.

Commonly, dielectric layers employed in the art are epoxy resins which exhibit CTE values of 70 ppm/° C. and higher. One approach to achieving reduction of CTE has been to employ heavy loadings of inorganic fillers on the order of 1-20 micrometers in average particle size. While reducing CTE, high loadings of inorganic fillers have resulted in increased brittleness, increased viscosity, poor adhesion strength, and degraded dielectric properties.

There is a clear need in the art for improved property trade-offs in epoxies employed in building up multilayer printed circuits.

Nakamura, US Patent Publication 2005/0129895 discloses the use of 30% by weight of spherical silica of unstated size in an epoxy composition. Nakamura provides no determinations of viscosity or flow performance, no measurement of CTE, and no determination of impact toughness.

Yasu, Japanese unexamined patent application JP 02263858 (abstract only), discloses epoxy compositions comprising ca. 60% by weight of hydrated alumina. No information about viscosity or flow is provided; no information regarding impact toughness, nor adhesive strength is provided.

Cochrane et al., Modern Paint and Coatings (October, 1983), discloses incorporation of a mixture of fumed silicas differing in particle size into epoxy compositions for the purposes of rheology control. Loadings of silica are 5% by weight or less.

SUMMARY OF THE INVENTION

The present invention provides a printed circuit comprising a dielectric substrate and a plurality of discrete conductive pathways disposed thereupon; said dielectric substrate comprising a film or sheet comprising the cross-linked reaction product of an aromatic epoxy and an aromatic cross-linking agent, and 20 to 60% by weight relative to the weight of said cross-linked reaction product of a particulate mixture comprising silica dispersed therein, said particulate mixture characterized by a bimodal particle size distribution of nanoscale particles.

Further provided is a process for preparing a printed circuit, the process comprising laminating copper to a film or sheet applying a photoresist to the surface of said copper, imagewise exposing said photoresist to light, and developing said imagewise exposed copper layer, thereby forming a plurality of discrete copper conductive pathways disposed upon said film or sheet, said film or sheet comprising the cross-linked reaction product of an aromatic epoxy and an aromatic cross-linking agent, and 20 to 60% by weight relative to the weight of said cross-linked polymer network of a particulate mixture dispersed therein, said particulate mixture characterized by a bimodal particle size distribution of nanoscale particles.

DETAILED DESCRIPTION

Figure 1:
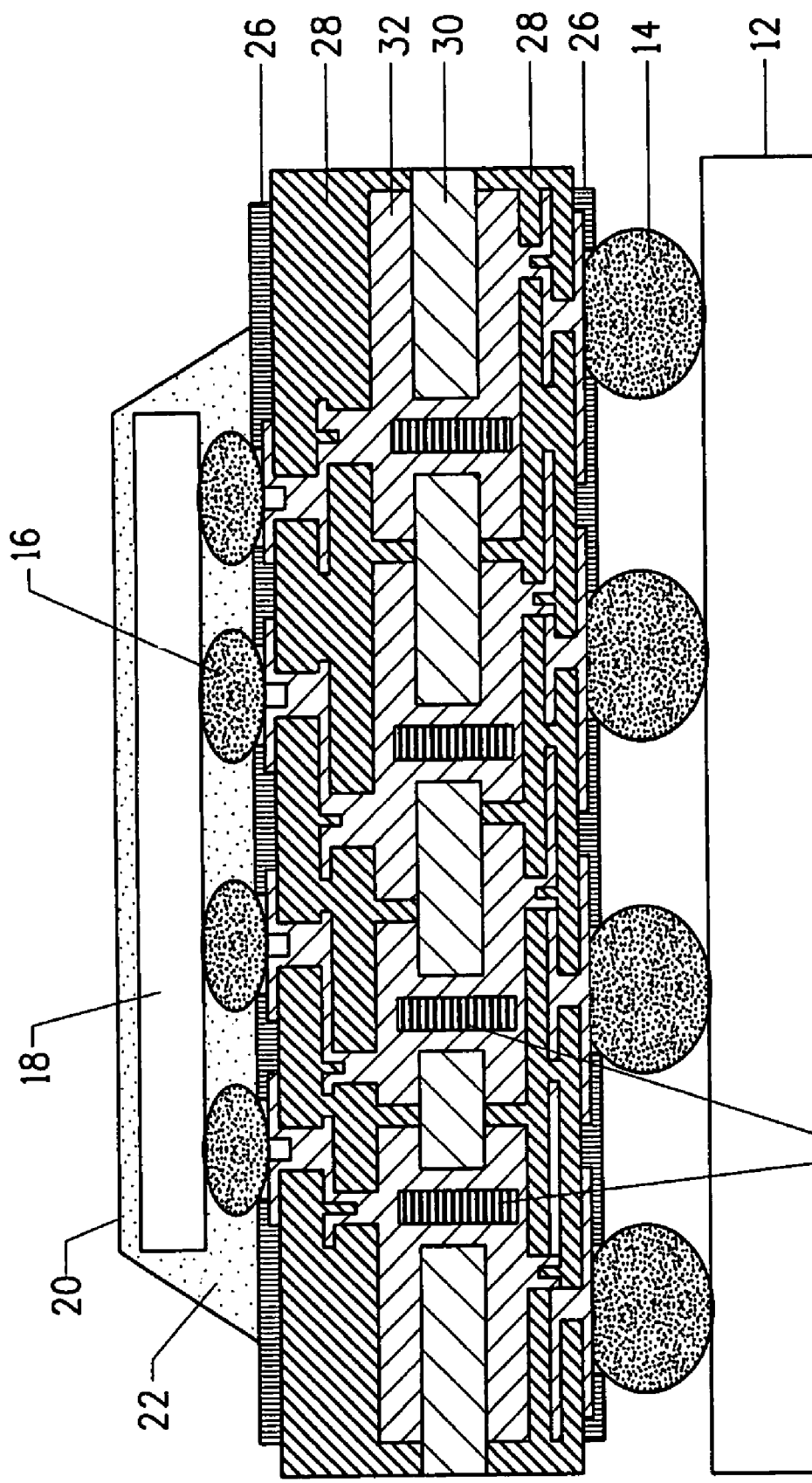
FIG. 1 represents a finished electronic component according to the present invention, including an IC chip mounted upon a multilayer circuit, which circuit in turn rests on a substrate or mother-board.

The term "epoxy" refers to a polymeric, generally an oligomeric, chemical comprising epoxide groups. A cross-linking agent suitable for use in the processes disclosed herein is a difunctional molecule reactive with epoxide groups. The cross-linked reaction product thereof is the reaction product formed when the cross-linking agent reacts with the epoxide or other group in the epoxy molecule. The term "epoxy" is conventionally used to refer to the uncured resin that contains epoxide groups. With such usage, once cured the epoxy resin is no longer actually an epoxy. However, reference to epoxy herein in the context of the cured material shall be understood to refer to the cured material. The term "cured epoxy" shall be understood to mean the reaction product of an epoxy as defined herein and a curing agent as defined herein.

The term "cured" refers to a composition that has undergone substantial cross-linking, the word "substantial" indicating an amount of cross-linking of 75% to 100% of the available cure sites in the epoxy. Preferably about 90% of the available cure sites are cross-linked in the fully cured composition. The term "uncured" refers to the composition suitable when it has undergone little cross-linking. The terms "cured" and "uncured" shall be understood to be functional terms. An uncured composition is characterized by solubility in organic solvents and the ability to undergo plastic flow. A cured composition suitable for the practice of the invention is characterized by insolubility in organic solvents and the absence of plastic flow under ambient conditions. In the practice of the present invention, some of the available cure sites in the uncured composition suitable for the practice of the invention will be cross-linked and some of the available cure sites in the cured composition suitable for the practice of the invention will remain uncross-linked. In neither case, however, are the distinguishing properties of the respective compositions significantly affected.

As discussed further herein below, there is also a partially cured state known as the "B-stage" material. The B-stage material may contain up to 10% by weight of solvent, and exhibits properties intermediate between the substantially cured and the uncured state.

A particulate mixture is a mixture of two or more materials which mixture is particulate in nature. It is not necessary that all the components of a particulate mixture be in particle form prior to their combination to form a particulate mixture. For example, a liquid surfactant may be dispersed with a particle, the surfactant being adsorbed upon the surface of the particles. The result would be a particulate mixture of a liquid and a solid particle. According to the present invention, two of the components of the particulate mixture are nano-scale particles.

The term nano-scale particles means particles having a size distribution such that at least 50% by weight of the particles are below 1 micrometer in "equivalent spherical diameter". Equivalent spherical diameter means the diameter of a hypothetical spherical particle having the same volume as the actual particle. Some suitable particles are irregular in shape. Most aggregate methods for determining particle size distribution, such as light scattering methods, determine the average equivalent spherical diameter. In the compositions and processes disclosed herein, particles having a bimodal size distribution are used. By "bimodal" is meant that there are two different values of equivalent spherical diameter, and as used herein, in the bimodal distribution of particles, particles having diameters below 1 micrometer are more frequent in the bimodal distribution than particles having other diameters. The more frequently occurring particle sizes in the distribution are referred to as "maxima". A bimodal particle distribution can be prepared by mixing two sets of particles of different average equivalent spherical diameter. As used herein, the term "bimodal" encompasses those embodiments wherein the particle distribution has two or more than two maxima. While there is no limit to the number of such local frequency maxima that may occur in the particle distributions suitable for the present invention, it is preferred that there be just two for most applications.

The terms "film" and "sheet" refer to planar shaped articles having a large length and width relative to thickness. Films and sheets differ only in thickness. Sheets are typically defined in the art as characterized by a thickness of 250 micrometers or greater, while films are defined in the art as characterized by a thickness less than 250 micrometers. As used herein, the term "film" encompasses coatings disposed upon a surface.

The term "discrete conductive pathway" as used herein refers to a conductive pathway disposed upon the cured film or sheet of the invention which leads uniquely from one point to another on the plane of the film or sheet, or through the plane from one side to the other, with no electrically conductive contact between two discrete conductive pathways.

A photoresist is a light-sensitive organic material. Imagewise exposure means that the photoresist surface is exposed to light which forms an image on the photoresist so that when the photoresist is developed and the surface etched, the image will appear in the form of a plurality of discreet conductive pathways upon the surface of the film or sheet suitable for the practice of the invention.

The present invention provides, in some embodiments, a printed circuit prepared from a composition comprising an epoxy and a cross-linking agent reactive therewith, or the cross-linked reaction product of an epoxy and a cross-linking agent reactive therewith, and 20 to 60% by weight relative to the total combined weight of the epoxy plus cross-linking agent of a particulate mixture dispersed therein, said having a bimodal particle size distribution of nanoscale particles.

It has now been discovered that the epoxy compositions disclosed herein that comprise nano-scale particles exhibit distinctively different properties from known epoxy compositions that differ from the present compositions only in that the filler particles in the known epoxy compositions are micrometer scale particles. For example, for the same filler loadings, nano-scale fillers have a lesser effect on the rheology of the uncured composition than do micro-scale fillers. In a preferred embodiment, up to 50 wt. % loading of nano-scale fillers were used in the uncured composition suitable for the practice of the invention without affecting the rheology. It was further found that a particulate loading characterized by a bimodal size distribution results in a lower viscosity composition than that when either of the types of particles are used singly at the same total loading. Thus, such particle loading can be used to provide highly filled compositions from which can be fabricated films or sheets with a CTE less than 50 ppm/C.° at temperatures below the glass transition temperature of the cured epoxy, without compromising the flow viscosity which is critical to good film forming and good lamination performance in the preparation of printed circuit boards. Viscosity is desirably sufficiently low that the uncured epoxy composition can be made to flow between the conductive pathways of a printed circuit board, filling all the space between them.

The compositions and processes disclosed herein represent a significant discovery in achieving a highly desirable balance of properties in epoxy-based printed circuits. Unlike filled compositions of the prior art, the compositions disclosed herein exhibit a highly favorable balance of low viscosity in the uncured state, and low coefficient of thermal expansion and toughness in the cured state. Furthermore, in preferred embodiments, the dielectric properties are not degraded compared to those of the unfilled composition.

Epoxies, curing agents, additives, and uses thereof are well known in the art. Epoxies are described, for example, in *The Encyclopedia of Polymer Science and Technology*, Volume 9, pp. 678-904. Preferred epoxies for use in the compositions disclosed herein are aromatic epoxies, although other types of epoxies can be used. Most preferred are o-cresol based novolac epoxy. "Novolac" is a term of art referring to the reaction product of phenol and formaldehyde.

Any curing agent known in the art can be used in the compositions and processes disclosed herein using known methods. Suitable curing agents include organic acid anhydrides and phenols as curing agents for epoxies. Monoanhydride curing agents are preferred for ease of handling.

The term "nano-scale filler" refers to the actual size of the filler particles. For example if nano-scale particles are agglomerated to form micron-scale particles, such agglomerates are not nano-scale particles and thus, are not preferred for use in the compositions and processes disclosed herein.

By following the teachings of the art and performing ordinary experimentation, it is within the purview of one of ordinary skill in the art to determine which combination of filler and epoxy is best suited for a particular application. There is no particular further limitation on the fillers selected. They may be of any size in the nano-scale range. Suitable nano-scale fillers include but are not limited to silicas, precipitated $CaCO_3$, alumina, mica powder, magnesia, boron nitride, aluminum nitride, barium titanate, strontium titanate, alkaline earth zirconates such as barium zirconate and calcium zirconate, and nano-clays. Included among suitable silica fillers are fumed silicas, amorphous and crystalline silicas, and colloidal silicas. In one embodiment, a suitable filler is fumed silica, which forms agglomerates of ca. 100-150 nanometers, in combination with spherical silica having a relatively narrow polydispersity in particle size distribution and an average size in the range of 600-700-nanometers.

The nano fillers may be surface modified, for example, to prevent agglomeration of particles, for better dispersion in polymers, improved bonding with matrix resin and/or to reduce moisture absorption in the cured dielectric composition. Suitable surface modifying compounds include but are not limited to silane coupling agents, organotitanates, and organozirconates. The silane coupling agents may or may not contain additional functional groups that can be used to enhance interfacial adhesion with the epoxy, and, thereby, provide higher toughness. Suitable compounds include aminopropyl triethoxysilane, aminophenyltriethoxy silane, methacryloxypropyl triethoxysilane, and glycidyloxypropyltriethoxysilane.

Nanoclays suitable for use in the compositions and processes disclosed herein include organic modified lamellar clays including smectic clays such as montmorillonite, saponite, beidelite, hectorite, laponite, and bentonite. The suitable clays have dimensions ranging from 10000 nm×2000 nm×10 nm to 250 nm×250 nm×1 nm. Depending upon the organic modification, compatibility with polymeric resin and dispersion techniques, the nanoclay can disperse as individual sheets or as collection of sheets in the polymers. Preferred nanoclays are the organic modified montmorillonite, hectorite and laponite.

In one embodiment, an epoxy composition is prepared in process comprising:

forming a composition by combining in a suitable solvent an epoxy resin comprising epoxide groups, a cross-linking agent reactive with said epoxide groups, and 20-60% by weight, based upon the total combined weight of the epoxy plus cross-linking agent, of a particulate mixture comprising a bimodal particle size distribution of nano-scale particles;

and, agitating the composition. It is desirable that the composition be homogenous.

While it is possible to prepare the epoxy compositions using a low molecular weight liquid epoxy as a dispersion medium for the bimodal nano-scale filler, such low molecular weight epoxies are less preferred than the pastier, more viscous, higher molecular weight high performance epoxies. While the reaction mixture so formed can be heated in order to lower viscosity, it is undesirable to apply heat, especially in the presence of a catalyst. It is therefore highly preferred to dissolve—or less preferably, disperse—the epoxy in a solvent.

Preferably, a suitable epoxy and the selected cross-linking agent are dissolved in a solvent. Suitable solvents include but are not limited to acetone, methyl ethyl ketone (MEK), pentanone, dioxolane, tetrahydrofuran, glycol ethers, propylene glycol methyl ether acetate (PMA), N-methyl pyrrolidone, N,N-dimethylacetamide, N,N-dimethylformamide (DMF), dimethyl sulfoxide, N,N-diethylacetamide, N,N-diethylformamide, N,N-dimethylmethoxyacetamide. Preferred solvents are MEK, PMA, and DMF. Mixtures of solvents are also suitable.

Separately, two or more nano-scale particle populations differing in average equivalent spherical diameter and having the properties recited hereinabove are combined in solvent, forming a dispersion. The particles are also referred to herein as "fillers" or "filler particles". Preferably the particulate combination is subject to ultrasonic agitation for ca. 30 seconds to break up agglomerates. It has been found that satisfactory results are obtained when 10-50 wt-% of the filler is made up of the finer particle distribution. The ratio of the average diameter of the finer fillers to the average diameter of the larger fillers can vary from 0.01 to 0.25. The preferred average diameter ratio is in the range 0.025 to 0.2. The particle shape can be spherical, elongated, or acicular. It is preferred to employ particles having a narrrow polydispersity in size distribution. Suitable filler contents range from 20-60% by weight of filler relative to the total combined weight of epoxy and curing agent. Preferred ranges are 30-60%. Total solids content of the solutions is in the range of 20-90% with 30-80% preferred.

Films and sheets can be prepared by any method known in the art as appropriate for the desired application and consistent with the viscosity of the particular solution employed. Methods include but are not limited to, spraying, dipping, paste extrusion, melt extrusion, and solution casting employing drawn down rods. Solution casting with draw-down is preferred.

In a preferred embodiment, the films or sheets are characterized by a coefficient of thermal expansion as low as 25 ppm/° C. and elongation to break of ca. 5%, and a dielectric constant as low as about 3.5 at 1 GHz. The films or sheets are desirably prepared from a highly flowable composition comprising an aromatic epoxy such as biphenol based epoxy or a cresol-modified novolac. Suitable curing agents are phenols and aromatic anhydrides. The epoxy and the curing agent are mixed in quantities based on their equivalent weights. In the case of phenolic curing agents, 0.3-0.9 equivalent of phenol is preferred for every equivalent of epoxy has been found to be suitable. With anhydride curing agents, 0.4-0.6 equivalent of anhydride is preferred for one equivalent of exoxy.

Curing of the uncured composition can be carried out via heating to a temperature of circa 65° C. in the absence of catalyst. Addition of catalyst accelerates the cure, while the absence of catalysts allows more complete removal of volatiles from relatively thick samples before the resin solidifies.

Suitable catalysts are described in numerous references such as Encyclopedia of Polymer Science and Technology, "Epoxy Resins" (John Wiley & Sons 2004), International Encyclopedia of Composites, "Epoxy Resins" (VCH Publishers 1990). Particularly suitable catalysts are tertiary amines and imidazoles. Preferred imidazole catalysts are N-methylimidazole, 2-methylimidazole, 2-ethyl-4methylimidazole, 2-phenylimidazole. Suitable concentration of catalyst is in the range 0.01-5 phr (parts per hundred weight resin) depending on the rate of cure desired.

Suitable particles for use as fillers include fumed silica in the form of semi-linear aggregates of ca. 100-150 nanometers in length, with an aspect ratio of ca. 5-10, combined with spherical silica of ca. 600-700 nanometers or nano-clays characterized by lamellar plates Suitable epoxies are aromatic epoxies comprising at least two epoxide groups per average polymer chain. Suitable aromatic epoxies include but are not limited to the glyidyl ether of biphenol-A, bisphenol F, epoxy novolacs (epoxidized phenol formaldehyde), naphthalene epoxy, the trigylcidyl adduct of p-aminophenol, and the tetraglycidyl amine of methylenedianiline, triglycidyl isocyanurates. Preferred epoxies include epoxy novolacs (epoxidized phenol formaldehyde polymers), biphenol epoxy, the trigylcidyl adduct of p-aminophenol, the tetraglycidyl amine of methylenedianiline, triglycidyl isocyanurates. Preferred uncured epoxies are oligomers having 1-5 repeat units. Most preferably the epoxy is a cresol—modified novolac.

Epoxies can be derivatized in any manner described in the art. In particular they can be halogenated, especially by bromine to achieve flame retardancy, or by fluorine.

Suitable phenol curing agents include biphenol, bisphenol A, bisphenol F, tetrabromobisphenol A, dihydroxydiphenyl sulfone and other phenolic oligomers obtained by the reaction of above mentioned phenols with formaldehyde. Suitable anhydride curing agents are nadic methyl anhydride, methyl tetrahydrophthalic anhydride and aromatic anhydrides.

Aromatic anhydrides include but are not limited to aromatic tetracarboxylic acid dianhydrides such as pyromellitic dianhydride, biphenyltetracarboxylic acid dianhydride, benzophenonetetracarboxylic acid dianhydride, oxydiphthalic acid dianhydride, 4,4'-(hexafluoroisopropylidene)diphthalic acid dianhydride, naphthalene tetracarboxylic acid dianhydrides, thiophene tetracarboxylic acid dianhydrides, 3,4,9,10-perylene tetracarboxylic acid dianhydrides, pyrazine tetracarboxylic acid dianhydrides, and 3,4,7,8-anthraquinone tetracarboxylic acid dianhydrides. Other suitable anhydride curing agents are oligomers or polymers obtained by the copolymerization of maleic anhydride with ethylene, isobutylene, vinyl methyl ether and styrene. Maleic anhydride grafted polybutadiene can also be used as a curing agent.

In some embodiments, mixtures of epoxies and/or mixtures of cross-linking agents can be used. A variety of additives can be included in the cured and uncured compositions. These include stabilizers, pigments, flow modifiers, UV light blockers, fluorescent additives, tougheners, plasticizers, and flame retardants known in the art.

Suitable tougheners are low molecular weight elastomers or thermolastic polymers and contain functional groups for reaction with epoxy resin. Examples are polybutadienes, polyacrylics, phenoxy resin, polyphenylene ethers, polyphenylene sulfide and polyphenylene sulfone.

Suitable solvents include but are not limited to acetone, methyl ethyl ketone (MEK), cyclohexanone, pentanone, dioxolane, tetrahydrofuran, glycol ethers, propylene glycol methyl ether acetate (PMA), N-methyl pyrrolidone, N,N-dimethylacetamide, N,N-dimethylformamide (DMF), dimethyl sulfoxide, N,N-diethylacetamide, N,N-diethylformamide, N,N-dimethylmethoxyacetamide. Preferred solvents are MEK, PMA, and DMF. Mixtures of solvents are also suitable.

The viscosity of the uncured composition can be adjusted by either adding solvent to decrease the viscosity, or by evaporating solvent to increase viscosity. The uncured composition can be poured into a mold, followed by curing, to form a shaped article of any desired shape. One such process known in the art is reaction injection molding. In particular, the composition can be used in forming films or sheets, or coatings. The viscosity of the solution is adjusted as appropriate to the requirements of the particular process. Films, sheets, or coatings are prepared by any process known in the art. Suitable processes include solution casting, spray-coating, spin-coating, or painting. A preferred process for forming a layer in a multi-layer printed circuit is solution casting using a Meyer rod for draw down of the casting solution deposited onto a substrate. The substrate can be treated to improve the wetting and release characteristics of the coating. Solution cast films are generally 10 to 75 micrometers in thickness.

In a preferred embodiment, the uncured composition is solution cast onto a release surface, preferably a polyethylene terephthalate film such as Mylar® film available from DuPont Teijin Films. The cast film then is subject to solvent removal to leave behind a high viscosity uncured or very lightly cured composition (B-stage) then disposed onto the surface of the previously prepared layer comprising conductive pathways, and the combination so formed is subject to pressure and temperature to prepare a laminate. Upon removal of the release film, the cast film can be cured and then become a new substrate for the deposition of a further plurality of conductive pathways.

Additional thermoplastic and thermosetting resins can be included in the cured or uncured composition. Examples of suitable thermosetting resin additives include a monofunctional epoxy resin as a diluent, an alicyclic polyfunctional epoxy resin, a rubber-modified epoxy resin, a blocked isocyanate resin and a xylene resin as an epoxy resin curing agent, and a polymerizable resin as a radical generating agent. Examples of suitable thermoplastic resin additives include polyimide, polyamideimide, polyether imide, polysulfone, polyether sulfone, polyphenylene ether, polycarbonate, polyether ether ketone, and, polyester.

The uncured composition when cured forms a cured composition that exhibits a highly beneficial combination of low coefficient of thermal expansion, high toughness, and high adhesion to copper.

In a preferred method for preparing the film, sheet, or layer the uncured composition is first dissolved in a solvent to form a coating solution, and the coating solution is then solution cast onto a substrate typically using a draw-down rod. Suitable substrates include polyolefins such as polyethylene and polyvinyl chloride; polyesters such as PET and polyethylene naphthalate; polycarbonate; polyimide; release paper; metallic foils such as copper foil and aluminum foil; and the like. The support film may be subjected to a mud treatment, a corona treatment, or a release treatment. The cast uncured film, sheet, or layer is then devolatilized to increase the viscosity of the cast film.

The uncured composition can be employed as a so-called "pre-preg" with a woven or non-woven fabric comprising carbon, glass, quartz, aramid, boron fibers, or ceramic whiskers or mixtures thereof, for the purpose of preparing a reinforced composite material, such as a core layer for printed circuit boards. A prepreg can be produced by dipping the woven or non-woven fabric into the epoxy resin composition by a hot melt method or a solvent method, and semi-curing it through heating.

Suitable solvents for preparing the coating solution include but are not limited to ketones such as acetone, methyl ethyl ketone, or cyclohexanone; acetate esters such as ethyl acetate, butyl acetate, cellosolve acetate, propylene glycol monomethyl ether acetate, or carbitol acetate; carbitols such as cellosolve or butyl carbitol; aromatic hydrocarbons such as toluene or xylene; dimethylformamide; dimethylacetamide; N-methylpyrrolidone; or mixtures thereof.

While appropriate conditions such as solution concentration, coating thickness, drying time and depend upon the particular compositions employed and the application intended, it has been found that a coating composition containing from 30 to 60% by weight of organic solvent can be dried at from 40 to 100° C. for from 1 to 10 minutes. Conditions can be adjusted so that the amount of the solvent remaining in the cured composition is 10% by weight or less, preferably 5% by weight or less, based on the total weight of the composition. The resulting composition, which is viscous and either uncured or slightly cured, is referred to in the art as the "B-stage." The combination of the substrate and the B-stage coating thereon are referred to herein as the "B-stage laminate and B-stage coating".

In one embodiment, drying of the B-stage composition is continued, followed by or accompanied by curing to prepare a fully or substantially cured film, sheet, or layer on the substrate. In one embodiment, a film or sheet is removed from the substrate to form a free-standing film or sheet. In a second embodiment, the cured layer remains on the substrate. Depending upon the materials and conditions employed, the film or sheet thereby prepared may be thermoformable. As a general rule, a thinner film, sheet or layer is more efficiently devolatilized than a thicker one. On the other hand, the more rapid the cure for a given thickness, the less efficient the devolatilization In one embodiment, the present invention provides a process for preparing a printed circuit, the process comprising laminating copper to a film or sheet, applying a photoresist to the surface of said copper, imagewise exposing said photoresist to light, and developing said imagewise exposed copper layer, thereby forming a plurality of discrete copper conductive pathways disposed upon said film or sheet. The film or sheet comprises a cross-linked polymer network derived from the reaction of an epoxy and a cross-linking agent, and 20 to 60% by weight relative to the weight of the cross-linked polymer network of a particulate mixture dispersed therein, the particulate mixture characterized by a bimodal particle size distribution of nanoscale particles.

An electronic chip mounted on a multi-layer printed circuit board of the type in common commercial use, is depicted schematically in FIG. 1. An integrated circuit chip, 18, is mounted via contacts, typically solder balls, 16, onto the multi-layer printed circuit (typically called integrated circuit chip substrate), which in turn is mounted on a larger printed circuit board, e.g., a computer motherboard, 12, via contacts, 14. The integrated circuit chip, 18, is encapsulated, typically with a cured epoxy resin, 22. The multi-layer integrated circuit chip substrate is made up of a core, 30, generally a multi-layer rigid fiber-reinforced dieletric ca. 150 to 800 micrometers in total thickness. The core, 30, is flanked by one or more layers on either or both sides by additional dielectric layers, typically of cured epoxy resins, 28, each layer typically ca. 35 to 65 micrometers in thickness. Each layer carries one or more, typically numerous, within-layer conductive pathways, 32, generally copper, seen in cross-section, typically 8-35 micrometers thick, as well as layer to layer conductive pathways or "vias," also seen in cross-section. The space between the conducting pathways in any layer is completely filled by the dielectric, 28.

FIG. 2 depicts schematically one manner in which multi-layer printed circuits are formed. In a first step, not shown, copper is uniformly deposited over the surface of a core, 30, typically one or more layers of epoxy-fiberglass or bismale-imide/triazine-epoxy/fiberglass composite sheet totaling 150 to 200 micrometers in thickness, provided with pre-drilled holes. Using well-known procedures, not shown, the copper is then coated with a photoresist, image-wise illuminated, developed, undesired copper regions etched away, and residual photoresist removed. Each side of the core-layer may be independently imaged. The result, FIG. 2A, is a two sided printed circuit board having both interlayer, 34, and within-layer, 32, [comment: can be conductor other than Cu] conductor pathways 8 to 15 micrometers thick. The space between the conductive pathways contains air or some other gaseous atmosphere at this stage. A second layer is then formed by applying a further dielectric layer. As shown in FIG. 2B, a backing sheet, typically of poly(ethylene terephthalate) (PET), 38, is coated with an uncured dielectric layer, 36, which is contacted to the printed circuit board of FIG. 2A. The uncured epoxy layer is laminated to the core surface by pressure and heat, causing it to flow into all the spaces on the core layer printed circuit, preferably filling them completely, as depicted in FIG. 2C. The backing sheet is removed, the laminated structure is subject to curing at elevated temperature, forming a new solid dielectric surface, 40, as depicted in FIG. 2D. New vias, 42, are then laser-cut into the solid dielectric surface, as depicted in FIG. 2E. The surface then undergoes a chemical desmear process to remove processing debris and to prepare the dielectric surface for electroless copper plating. A thin layer of copper, 44, is then applied using electroless method. A photoresist is applied and the photoresist is imaged, FIG. 2G, and developed to form a pattern, 46. Then a layer of copper ca. 8 to 15 micrometer thick is electroplated onto the surface thereby produced, and the photoresist stripped off, and undesired electroless copper chemically etched off, FIG. 2G, leaving a new layer of copper conductive pathways, 48. Additional layers may be applied in a similar manner.

Figure 2A:
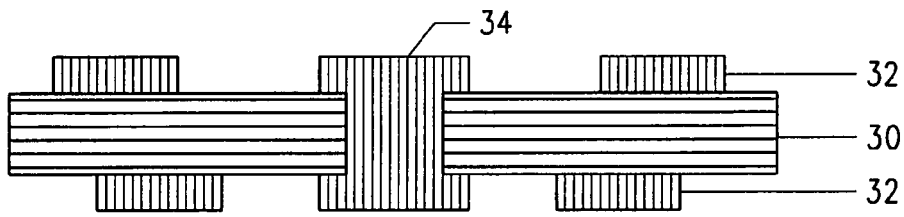
FIG. 2 represents the steps for preparing multilayer printed circuits according to an embodiment the present invention.
Figure 2B:
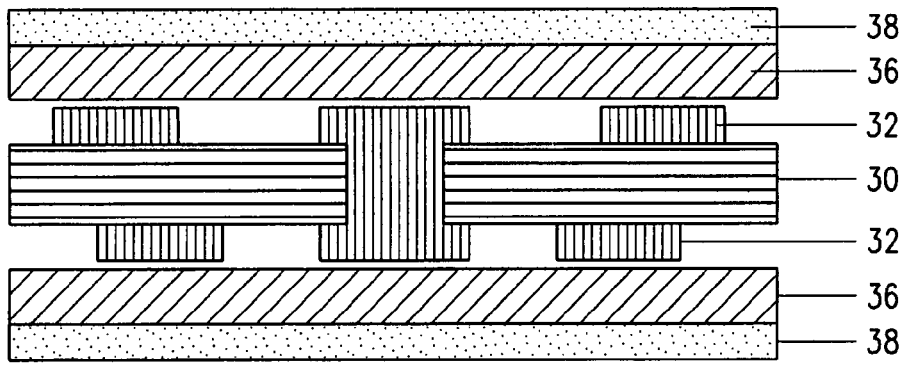
Figure 2C:
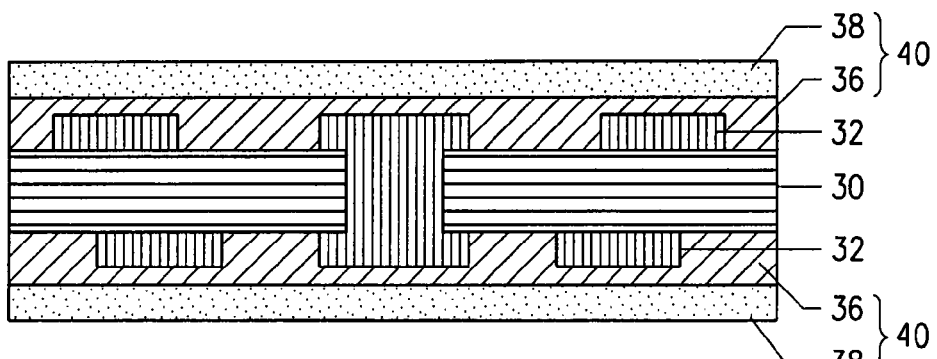
Figure 2D:
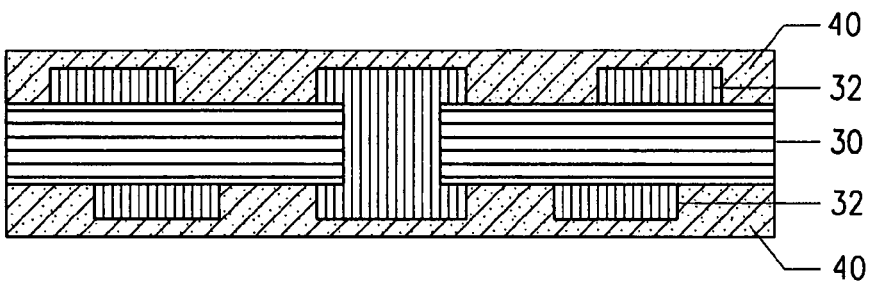
Figure 2E:
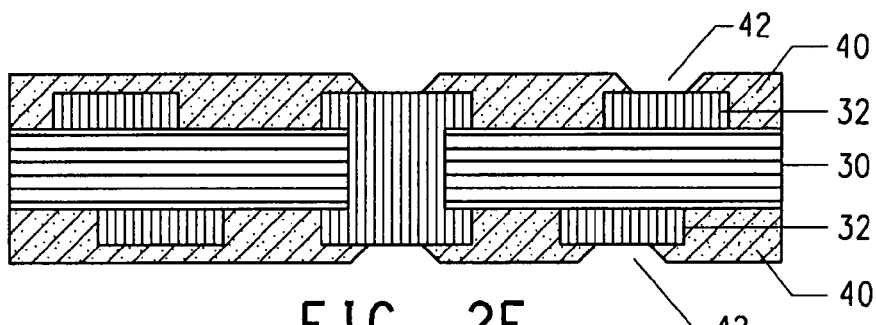
Figure 2F:
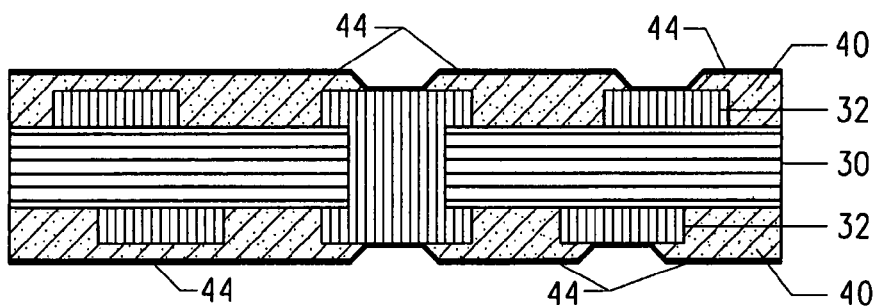
Figure 2G:
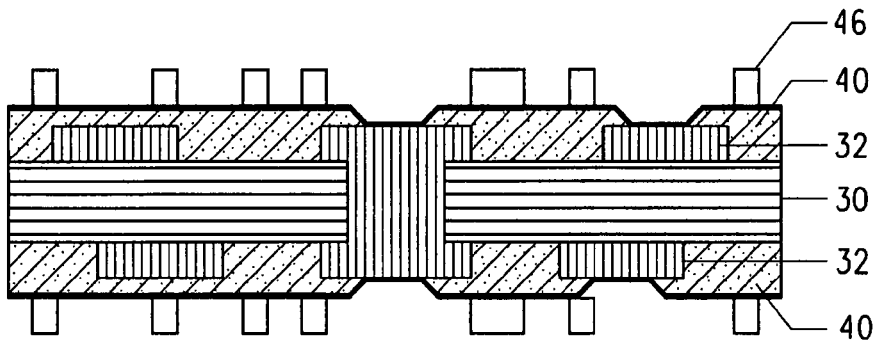
Figure 2H:
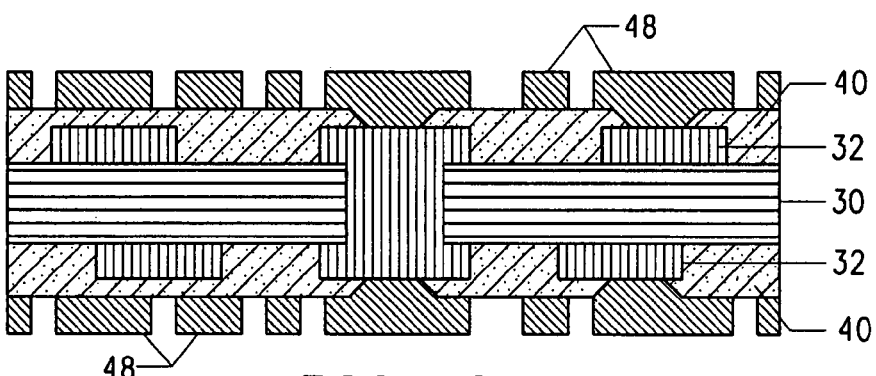

In one embodiment, referring to FIG. 2, in FIG. 2B, the B-stage layer 10-150 μm in thickness, 36, is laminated to a release sheet, 38, preferably a PET sheet 150-200 μm in thickness, such as Mylar® from DuPont Teijin films, and positioned so that the B-stage layer contacts a reinforced core layer, 30, having electrically conductive pathways, both in-plane, 32, and through-plane, 34, disposed thereupon, the electrically conductive pathways being separated by open spaces. In FIG. 2C, the B-stage laminate so disposed is subject to heat and pressure, typically 70-140° C. and 0.1-1.1 MPa, preferably using vacuum lamination equipment at a pressure preferably not exceeding 20 torr, thereby causing the B-stage composition to flow into the open spaces and filling them. In FIG. 2D, the release sheet of the B-stage laminate is removed, and the newly formed laminated printed circuit board is subject to heating to cure the B-stage composition. Thermal curing is effected in the temperature range of 150° C. to 220° C., preferably 160 to 200° C. for a period of 20 minutes to 17 hours, preferably 30 min to 4 hours. In FIG. 2E, the now-exposed surface of the cured layer, 40, is chemically etched to roughen it, and and thin layer of electroless copper is applied to the surface. A photoresist layer is applied to the surface, and the photoresist is subject to imagewise irradiation. the image so imposed is developed by ordinary means in common use in the art. Additional copper is then deposited on the exposed electroless copper surface typically via electrolytic methods. The residual photoresist is then removed, and the excess electrolessly deposited copper chemically etched away to leave behind a pattern of in-plane, 32, and through-plane, 34 conductive pathways. The process may be repeated, in principle without limit, and on both sides of the core material, to build up a multilayer printed circuit board.

The above illustrated embodiment is not meant to be limiting. There are a variety of designs of printed circuit boards and a number of fabrication processes, such as those described in M. W. Jawitz, "Printed Circuit Board Materials Handbook", McGraw-Hill (1997), Clyde Coombs, Jr., "Printed Circuits Handbook", 5th edition, McGraw-Hill Professional (2001), and IPC/JPCA—2315 Standard "Design Guide for High Density Interconnects and Microvias"

In another method of building multilayer circuits for which compositions disclosed herein are well suited, the dielectric is coated on copper foil to form a copper clad typically known as resin coated foil (RCF), and laminated to a core such as structure 1 in FIG. 2 Such a process is described in Chapter 11, Coombs (2001), cited hereinabove. The structure is then subjected to further conductor patterning processes.

In one embodiment, a resin coated foil is prepared by coating a metallic, preferably copper, foil with the uncured composition of the invention. In one embodiment, a the uncured composition suitable for the practice of the invention is metered onto a moving copper foil using a combination of coating and compression rolls in a continuous process. Other suitable coating processes are blade or knife coating, slot or extrusion coating, gravure coating, slide coating, and curtain coating. The coated foil is then dried, typically in an oven, to increase the viscosity of the uncured coating, partially curing it to form the so-called B-stage composition. In a continuous process, the foil coated with the B-stage composition can be wound on a roll for further use. In some embodiments, a first coating layer is fully cured, and then the coated foil is further coated with one or more additional layers.

In an alternative embodiment, the B-stage laminate is fully cured by itself, following which steps 5-7 above may be performed thereupon to form a single layer printed circuit board. Upon removal of the relase sheet, if desired, the same steps can be performed to form a single-layer, two sided printed circuit board. The printed circuit board so formed can serve as the core layer of a multi-layer printed circuit board as described above, or it can remain a single layer printed circuit board. In a preferred embodiment thereof, the composition further comprises reinforcing fibers such as carbon, silica, aramid, or glass.

Whether in a single layer or as part of a multi-layer structure, the cured layer can be bored with a drill, a laser or the like to form via holes or through-holes.

The conductive metal layer can be formed by dry plating or wet plating. Dry plating methods known in the art include sputtering or ion plating. In wet plating, the surface of the cured layer is first roughened with an oxidizing agent such as a permanganate, a bichromate, ozone, hydrogen peroxide/sulfuric acid or nitric acid to form an uneven surface ("anchor") for anchoring the conductive layer. The conductor can then be formed by a method combining electroless plating and electroplating.

The invention is further described in the following non-limiting specific embodiments.

EXAMPLES

Resin:

An o-cresol novolac epoxy combined with a phenolic hardener, was dissolved in MEK to form a 61.5% solids solution and used in the following examples. The phenolic hardener and the epoxy was mixed on the basis of their equivalent weights. The mix ratio of 0.9 equivalent of hardener to one equivalent of epoxy was used in all the examples. 2-Methyl imidazole was used as a catalyst, at 0.1 to 0.2 parts per hundred parts of the combined epoxy resin and the hardener resin. The catalyst was added after mixing the epoxy, hardener and filler.

The thus filled epoxy composition was cured by heating at 140° C. for 3.5 min. followed by heating at 188° C. for 90 min under 300 psi pressure in a Vac-Q-Hot vacuum press (OEM Press Systems Inc, Fullerton, Calif.), under 29" mercury vacuum. A control composition without filler was cured under the same conditions in the vacuum press but without any applied pressure.

Fillers:

A 12 weight-% dispersion in MEK of Aerosil R7200 fumed silica (Degussa), surface modified by treatment with trimethyloxysilylpropyl methacrylate, was subject to milling using using 0.4 mm cubic zirconia beads in a 1.5 L Premier Mill Glycidyloxypropyl triethoxysilane at 1.5 wt % based on the silica was added to the dispersion before milling to modify the freshly generated surfaces upon milling. The particle size was measured using a Mastersizer 2000 (Malvern Instruments, Worcestershire, UK) and the average particle size (d50) of the milled silica was determined to be 0.13 μm. The solid content of the dispersion was 11.7% by weight.

SE1050-SE spherical silica, (Admatech) was obtained from Tomen America, Charlotte, N.C. This silica was surface modified with glcidyloxypropyltriethoxysilane by the manufacturer. The as received silica had particles in the size range 0.1 to 2.26 micron, with an average size (d50) of 0.598 micrometer determined as above in an MEK dispersion thereof.

When the spherical silica was combined with other fillers, an ultrasonic probe (40 KHz, Dukane Corporation, St. Charles, Ill.) was dipped into the filler-containing solution and agitation was effected for four minutes at room temperature while moving the probe from place to place in the solution.

Cloisite 30B nanoclay was obtained from Southern Clay Products Inc, (Gonzales, Tex.). The clay was modified with bis(hydroxyethyl)methyl hydrogenated tallow surfactant for good dispersion in polymers. The clay is available as 325 mesh powders. The clay primary particle is a lamellar sheet, about 200 nm in length and width and 1 nm in thickness.

Coefficient of Thermal Expansion:

The glass transition temperature ($T_g$) and the in-plane (x,y-direction) thermal expansion coefficient (CTE) of the cured film was determined using a Thermal Mechanical Analyzer by following the IPC test method Number 2.4.24.5. The in-plane (x-direction) and out-of-plane (z-direction) thermal expansion coefficient of the cured film was determined using a Thermal Mechanical Analyzer by following the IPC test method Number 2.4.24.

Dielectric Film Flow:

In each example, a 38-51 micrometer (1.5-2.0 mil) coating of the epoxy composition was applied to a PET film The thus coated film was dried for one hour in the laboratory hood at room temperature. The thus-dried film was laminated to a standard FR4 epoxy/fiber-glass board commonly used as a mother board in electronic devices. The lamination was performed at 120° C. for five minutes under vacuum and at 150 psi pressure. If the epoxy composition exhibited good flow, the dielectric film would be smooth, bonded well to the FR4 core, and showed no cracks under microscopic examination. If the dielectric composition exhibited poor flow, the dielectric film surface would be rough, the film peeled off from the FR4 core and showed islands of smooth and rough sections in the film.

Comparative Example 1

21.1 g of the above-prepared epoxy solution in MEK was combined with 0.0169 g of catalyst in 10 ml of MEK. Stirring was continued for 1 hour at room temperature using a magnetic stirrer. A PET film was solution coated with a ca. 50 micrometer film of the composition so formed using a doctor blade (Gardco Adjustable Micrometer Film Applicator, Paul N. Gardner Co., Inc.), and the thus applied coating was allowed to dry at room temperature for two hours. The remainder of the epoxy composition was poured into a Teflon® PTFE coated pan and allowed to dry overnight in the laboratory hood at room temperature to form a viscous mass. The thus prepared viscous mass was poured into a 4"×4"×10 mil (10.2 cm×10.2 cm×0.25 mm) copper mold and cured in the vacuum press, without any applied pressure, to form a solid plaque.

The coated PET was employed for the dielectric flow test as described supra. The resultant laminate was smooth, crack-free and displayed good adhesion to the core.

The molded 10 mil plaque was employed in the CTE/$T_g$ test described herein above, in the x,y-direction. Results are shown in Table 1.

A further molded plaque was prepared using a 2"×2"×60 mil (5.08 cm×5.08 cm×1.5 mm) mold and the x and z direction CTE and $T_g$ were determined. Results are shown in Table 2.

Comparative Example 2

The materials and procedures of Comparative Example 1 were repeated, except that the fumed silica was added to and dispersed within the epoxy composition of Comparative Example 1. While stirring, 21.1 g of the previously prepared MEK solution of the epoxy and curing agent was mixed with 59.8 g of a 11.7 wt.-% milled dispersion of Aerosil R7200 in MEK using a magnetic stirrer to form a mixture comprising 65 wt-% epoxy and curing agent and 35 wt. % silica. Stirring was continued for 30 minutes to get a homogeneous dispersion. To the dispersion so prepared was added 0.0169 g of catalyst in 10 ml of MEK. The remainder of the procedures of Comparative Example 1 were repeated. In the dielectric test, the laminate was not smooth and displayed patches of poor resin flow across the surface. The CTE/$T_g$ could be determined only in the tensile mode according to the standard test method. Results are shown in Table 1.

A 60 mil (1.5 mm) thick plaque is required for the determination of CTE in the x and z directions according to the test method. Attempts to prepare such a plaque failed. The filled resin did not fuse well. After curing, the plaque cracked into several pieced. The cured material appeared like a pellet or tablet, reminiscent of compression molded powders.

Comparative Example 3

The materials and procedures of Comparative Example 2 were repeated except that the ratio of epoxy to silica was 60/40 by weight. In the dielectric test, the laminate was not smooth and displayed patches of poor resin flow across the surface. The CTE/$T_g$ in the x-y plane was determined. Results are shown in Table 1.

Again an attempt was made, as in Comparative Example 2, to form a 60 mil plaque but the result was the same as in Comparative Example 2.

TABLE 1

| Comparative Example | Composition | $T_g$ (° C.) | CTE (ppm/° C.) <$T_g$ | CTE (ppm/° C.) >$T_g$ |
|---|---|---|---|---|
| 1 | epoxy resin | 170 | 78 | 155 |
| 2 | 65 epoxy/35 silica | 146 | 57 | 129 |
| 3 | 60 epoxy/40 silica | 150 | 40 | 83 |

TABLE 2

| | Comparative Example 1 | | |
|---|---|---|---|
| | Tg | CTE < Tg | CTE > Tg |
| x | 168 | 63 | 155 |
| z | 134 | 71 | 262 |

Example 1

To 21.1 g of the epoxy resin in MEK solution of Comparative Example 1 was added 29.9 g of the milled Aerosil R7200 dispersion in MEK containing 3.5 g of fumed silica and the mixture was stirred for 15 minutes. Then 3.5 g of SE1050-SEO silica was added in the powder form and stirred for 30 minutes. The combined dispersion was subject to ultrasonic probe mixing at room temperature for four minutes, as described supra. Then 0.0169 g of the catalyst in 10 ml MEK solution was added to the dispersion and stirred for 30 minutes.

A 2 mil (50.8 micrometer) thick coating of the dielectric composition was cast on a PET film using a Gardco Film Applicator and allowed to dry for two hours at room temperature. The remaining solution was poured into a Teflon® coated pan and allowed to dry overnight at room temperature in the laboratory hood. The isolated viscous mass placed into a 2"×2"×60 mil (5.08 cm×5.08 cm×1.5 mm) stainless mold and cured under 300 psi (2.07 MPa) pressure.

In the dielectric flow test, the laminated film before curing and after curing were uniformly smooth and free from microcracks. CTE/$T_g$ (x and z-direction) are shown in Table 3.

TABLE 3

| | x,-direction | z-direction |
|---|---|---|
| $T_g$ (° C.) | 161 | 131 |
| CTE (ppm/° C.) (<$T_g$) | 46 | 41 |
| CTE (ppm/° C.) (>$T_g$) | 127 | 79 |

Example 2

While stirring, 21.1 g of the epoxy resin composition in MEK solution previously prepared was combined with 25.6 g of the 12% solids milled Aerosil R7200 silica dispersion containing 3 g of the fumed silica. Stirring was continued for 15 minutes. Separately 4 g of Cloisite 30B was dispersed in 60 ml of MEK by stirring at room temperature for an hour. The ultrasonic probe was applied to the Cloisite dispersion so prepared for about four minutes at room temperature to facilitate the dispersion in the solvent. The Cloisite dispersion was transferred immediately to the silica and epoxy resin dispersion prepared as herein above described, and the resulting mixture was stirred using a magentic stirrer for about 30 minutes. Then 0.0169 g of the catalyst in 10 ml of MEK was added to the dispersion and stirring was continued at room temperature for about 30 minutes further.

A 2 mil (ca. 50 micrometer) thick coating of the epoxy composition so prepared was cast on a PET film and allowed to dry for two hours at room temperature. The remaining solution was poured into a Teflon® coated pan and allowed to dry overnight at room temperature in the laboratory hood. The isolated viscous mass placed into a 2"×2"×60 mil (5.08 cm×5.08 cm×1.5 mm) stainless mold and cured under 300 psi (2.07 MPa) pressure.

In the dielectric flow test, both the as-laminated film and the cured laminate film were uniformly smooth and free from cracks. The results of the CTE/T$_g$ (x and z directions) test are shown in Table 4

Example 3

The materials and procedures of Example 2 were repeated except that the Cloisite was dispersed in DMF instead of MEK. 4 g of the nanoclay was dispersed in 60 ml of dimethyl formamide (DMF) by stirring at room temperature for an hour. Then the ultrasonic probe was applied for four minutes to get a good dispersion and then the resulting dispersion was mixed with the Aerosil silica and epoxy dispersion prepared as in Example 2. The coating and cured samples for CTE measurement were made as described above.

In the dielectric flow test, both the as-laminated film and the cured laminate film were uniformly smooth and free from cracks.

The results of the CTE/T$_g$ test are shown in Table 4

TABLE 4

| | | x-direction | | | z-direction | |
| | | CTE (ppm/°C.) | | | CTE (ppm/°C.) | |
| Solvent for nanoclay dispersion | T$_g$ (°C.) | (<T$_g$) | (>T$_g$) | T$_g$ (°C.) | (<T$_g$) | (>T$_g$) |
|---|---|---|---|---|---|---|
| Example 2 MEK | 170 | 38 | 68 | 140 | 38 | 186 |
| Example 3 DMF | >280 | 35 | 35 | 117 | 36 | 323 |

We claim:

1. A printed circuit comprising a dielectric substrate and a plurality of discrete conductive pathways disposed thereupon; said dielectric substrate is a film or a sheet comprising a cross-linked reaction product of an aromatic epoxy and an aromatic cross-linking agent, and 20 to 60% by weight relative to the weight of said cross-linked reaction product of a particulate mixture; said particulate mixture comprising a first set of particles consisting essentially of fumed silica characterized by having an average spherical diameter from 100-150 nm, and a second set of particles wherein the second set of particles is selected from spherical silica and nano clays; said spherical silica having an average diameter from 600-700 nm and said nano clays having a shape of lamellar plates having a dimension ranging from 10,000 nm×2,000 nm×10 nm to 250 nm×250 nm×1 nm.

2. The printed circuit of claim 1, wherein said aromatic epoxy is an o-cresol novolac and said aromatic cross-linking agent is a phenol or an anhydride.

3. The printed circuit of claim 1, wherein said fumed silica representing 10-30% by weight of the total particulate mixture.

4. A process for preparing a printed circuit, the process comprising laminating copper to a film or a sheet, applying a photoresist to said copper surface, imagewise exposing said photoresist to light, and developing said imagewise exposed copper layer, thereby forming a plurality of discrete copper conductive pathways disposed upon said film or sheet, said film or sheet comprising a cross-linked reaction product of an aromatic epoxy and an aromatic cross-linking agent, and 20 to 60% by weight relative to the weight of said cross-linked polymer reaction product of a particulate mixture dispersed therein said particulate mixture comprising a first set of particles consisting essentially of fumed silica characterized by having an average spherical diameter from 100-150 nm, and a second set of particles wherein the second set of particles is selected from spherical silica and nano clays; said spherical silica having an average diameter from 600-700 nm and said nano clays having a shape of lamellar plates having a dimension ranging from 10,000 nm×2,000 nm×10 nm to 250 nm×250 nm×1 nm.

5. The process of claim 4, wherein said aromatic epoxy is an o-cresol novolac and said aromatic cross-linking agent is a phenol or an anhydride.

6. The process of claim 4, wherein said fumed silica representing 10-30% by weight of the total particulate mixture.

* * * * *